(12) United States Patent
Sharma et al.

(10) Patent No.: US 12,087,750 B2
(45) Date of Patent: Sep. 10, 2024

(54) STACKED-SUBSTRATE FPGA SEMICONDUCTOR DEVICES

(71) Applicant: INTEL CORPORATION, Santa Clara, CA (US)

(72) Inventors: Abhishek A. Sharma, Hillsboro, OR (US); Willy Rachmady, Beaverton, OR (US); Ravi Pillarisetty, Portland, OR (US); Gilbert Dewey, Beaverton, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 895 days.

(21) Appl. No.: 16/140,911

(22) Filed: Sep. 25, 2018

(65) Prior Publication Data

US 2020/0098737 A1   Mar. 26, 2020

(51) Int. Cl.
*H01L 25/18* (2023.01)
*H01L 23/00* (2006.01)

(52) U.S. Cl.
CPC .............. *H01L 25/18* (2013.01); *H01L 24/32* (2013.01); *H01L 24/83* (2013.01); *H01L 2224/32145* (2013.01); *H01L 2224/83896* (2013.01); *H01L 2924/1431* (2013.01); *H01L 2924/1437* (2013.01)

(58) Field of Classification Search
None
See application file for complete search history.

(56) References Cited

U.S. PATENT DOCUMENTS

| | | | | |
|---|---|---|---|---|
| 4,902,637 A | * | 2/1990 | Kondou | .............. H01L 27/0688 257/E21.538 |
| 5,793,115 A | * | 8/1998 | Zavracky | ................ H01L 24/24 257/E21.705 |
| 6,232,637 B1 | * | 5/2001 | Gardner | .............. H01L 27/0688 257/67 |
| 6,475,889 B1 | * | 11/2002 | Ring | ................... H01L 21/0445 257/E21.054 |

(Continued)

OTHER PUBLICATIONS

Kirk Saban, "Xilinx Stacked Silicon Interconnect Technology Delivers Breakthrough FPGA Capacity, Bandwidth, and Power Efficiency", Dec. 11, 2012, White Paper: Virtex-7 FPGAs, Xilinx, WP380 (v1.2), 10 pages.

(Continued)

*Primary Examiner* — Nishath Yasmeen
(74) *Attorney, Agent, or Firm* — Schwabe, Williamson & Wyatt P.C.

(57) ABSTRACT

A stacked-substrate FPGA device is described in which a second substrate is stacked over a first substrate. Logic transistors (e.g., semiconductor devices and at least some conductive interconnections between them) are generally fabricated on (or over) a first substrate and memory transistors (e.g., SRAM cells and SRAM arrays) are generally fabricated on a second substrate over the first substrate. This has the effect of physically disposing elements of a CLB and a programmable switch on two different substrates. That is a first portion of a CLB and a programmable switch corresponding to logic transistors are on a first substrate and a second portion of these components of an FPGA corresponding to SRAM transistors is on a second substrate.

20 Claims, 9 Drawing Sheets

(56) References Cited

U.S. PATENT DOCUMENTS

| | | | |
|---|---|---|---|
| 7,521,715 B2* | 4/2009 | Jang | H10B 10/125 |
| | | | 257/69 |
| 7,719,033 B2* | 5/2010 | Jeong | H01L 27/0688 |
| | | | 257/70 |
| 7,923,207 B2* | 4/2011 | Robertson | C12N 15/87 |
| | | | 435/6.16 |
| 9,281,305 B1* | 3/2016 | Yang | H01L 21/823814 |
| 9,768,143 B2* | 9/2017 | Lin | H01L 24/02 |
| 2003/0129829 A1* | 7/2003 | Greenlaw | H01L 23/481 |
| | | | 257/E21.597 |
| 2004/0178819 A1* | 9/2004 | New | H01L 25/18 |
| | | | 257/E27.11 |
| 2006/0234487 A1* | 10/2006 | Kim | H01L 21/76898 |
| | | | 257/E21.597 |
| 2007/0048913 A1* | 3/2007 | Son | H01L 21/76898 |
| | | | 257/E21.705 |
| 2008/0023770 A1* | 1/2008 | Kim | H01L 21/28556 |
| | | | 257/E25.018 |
| 2008/0111198 A1* | 5/2008 | Jang | H01L 27/0688 |
| | | | 257/E27.06 |
| 2009/0258462 A1* | 10/2009 | Konevecki | H01L 27/12 |
| | | | 257/E21.602 |
| 2011/0101467 A1* | 5/2011 | Jang | H01L 27/0688 |
| | | | 257/E27.06 |
| 2015/0021784 A1* | 1/2015 | Lin | H01L 25/0657 |
| | | | 438/459 |
| 2015/0235949 A1* | 8/2015 | Yu | H01L 25/0652 |
| | | | 257/774 |
| 2017/0062319 A1* | 3/2017 | Guo | H01L 21/4846 |
| 2017/0125383 A1* | 5/2017 | Liu | G11C 8/12 |

OTHER PUBLICATIONS

Tobias Höchbauer, "On the Mechanisms of Hydrogen Implantation Induced Silicon Surface Layer Cleavage", Nov. 2001, presented by Department of Chemistry the Philipps University Marburg, 209 pages.

* cited by examiner

STACKED-SUBSTRATE FPGA SEMICONDUCTOR DEVICES

BACKGROUND

Field programmable gate array (FPGA) devices are integrated circuit devices that have become increasingly common and useful in many applications. FPGA devices include various elements that can be programmed (and in some cases re-programmed) by a user. These various elements include configurable logic blocks (CLBs), memory cells, and reconfigurable interconnects (also referred to as programmable switches) that can change the connectivity between CLBs themselves as well as between CLBs and memory cells. Some FPGAs are fabricated as multiple die (or "chips") on a common electronic package substrate (whether indirectly on a silicon interposer or directly on a laminate board), where for example one chip is primarily associated with memory cells and another chip is associated with the CLB (i.e., logic transistors). More recently, some FPGAs are fabricated as a "system on a chip," in which logic transistors (associated with reconfigurable CLBs), memory cells or arrays, and reconfigurable interconnections are all disposed on a common semi conductor substrate.

Figure 1A:
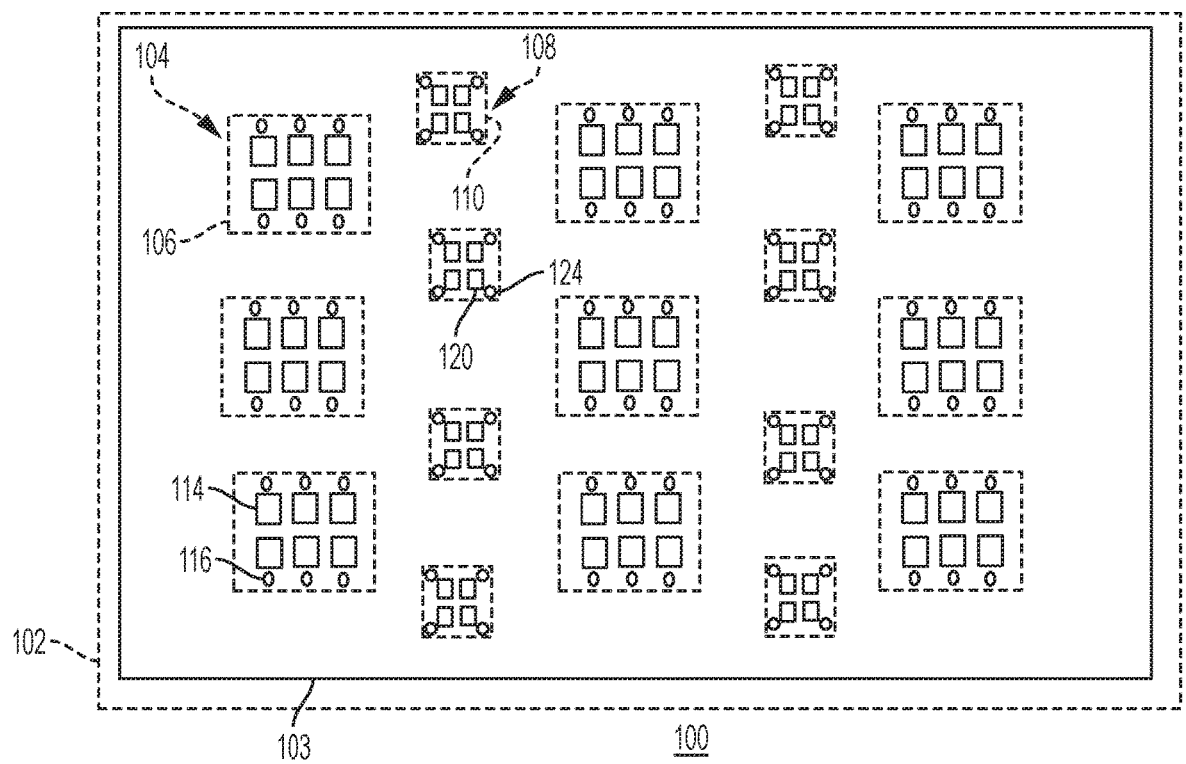
FIGS. 1A and 1B are schematic plans view of an FPGA device in a stacked-substrate configuration, in accordance with some embodiments of the present disclosure.

The figures depict various embodiments of the present disclosure for purposes of illustration only. Numerous variations, configurations, and other embodiments will be apparent from the following detailed discussion. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

It is noted that designations such "above" or "below" or "top" or "bottom" or "top side" or "bottom side" are not intended to necessarily implicate a limitation as to orientation of the embodiments described herein. Rather, such terminology is simply used in a relative sense to consistently describe a structure as it exists in any one particular orientation and as illustrated herein. In addition, designations such as "over" are not intended to necessarily implicate a limitation as to one structure being distinct from another underlying structure. For example, if an integrated circuit integrated circuit is over a first semiconductor substrate and below a second semiconductor substrate, the integrated circuit may be formed on a topside of the first substrate by depositing additional materials onto the topside of the first substrate, or by shaping (by way of lithography and etching) a portion of the first substrate into one or more parts of the integrated circuit, or by a combination such depositing and shaping. In still other embodiments, the integrated circuit may be formed on a backside of the second substrate by depositing additional materials onto the backside of the second substrate, or by shaping (by way of lithography and etching) a portion of the second substrate into one or more parts of the integrated circuit, or by a combination such depositing and shaping.

DETAILED DESCRIPTION

Techniques are disclosed for fabricating a stacked-substrate FPGA integrated circuit device in which logic devices and memory cells (e.g., SRAM cells) associated with configurable logic blocks (CLBs) and programmable switches are disposed on different substrates. In one example such embodiment, logic devices are over a first substrate and SRAM cells are over a second substrate that itself is over the first substrate, thus forming an FPGA integrated circuit device having a stacked-substrate assembly. The second substrate has a thickness of less than 200 nm in some example cases, or less than 100 nm in still other example cases. Vias are fabricated to pass through the second substrate and into a dielectric layer between the first substrate and the second substrate. The vias connect the components of the CLBs together, connect the components of the programmable switches together despite the disposition of these components on two different, stacked substrates. In some examples, I/O blocks are disposed on yet another substrate and connected to CLBs and programmable switches by through-substrate vias. This stacked-substrate configuration, as variously described herein, can increase a density of transistors (whether associated with logic functions or memory functions) relative to FPGA devices in which CLBs, programmable switches, I/O blocks and memory arrays (and their individual components) are all on a same substrate. Furthermore, by having a second substrate that is less than 100 nm or less than 200 nm thick, the vias passing through the substrate can have a depth that is less than 200 nm (e.g., less than 150 nm). Vias having such a relatively short length can result in favorable electrical characteristics (e.g., a low resistance of between 1 Ohm and 40 Ohms).

General Overview

For all types of integrated circuit devices, increasing a density of circuits per unit area of substrate is often accomplished by shrinking the dimensions of transistors and their associated interconnections. Shrinking these dimensions often requires changes to one or more of circuit design ground rules, semiconductor device configuration, and processing techniques. This method of increasing density can be challenging when applied to field programmable gate array (FPGA) integrated circuit devices. This is because FPGA devices are composed of different types of integrated circuit groups that are configured for coordinated operation. A first type of integrated circuit group is a configurable logic block (CLB) that includes a variety of random logic transistors that include, but are not limited to transistor pairs, NAND gates, OR gates, look up tables (LUTs), multiplexers, among others. CLBs can also include some memory elements, whether dynamic access memory (DRAM) or static random access memory (SRAM). LUTs within the CLBs are often instantiated using static SRAM cells or SRAM arrays (i.e., arrangements of multiple SRAM cells), whether 4 transistor (4T), 6 transistor (6T), or some other type of SRAM configuration. A second type of integrated circuit group is a programmable switch that includes SRAM cells, multiplexers, and conductive interconnections. These programmable switches are associated with conductive interconnections that connect the programmable switches to the CLBs, and therefore (indirectly) connect the CLBs to one another. Input/output (I/O) circuits and structures (e.g., I/O contact pads) are generally connected to programmable switches and enable signals to be transmitted between the FPGA device and computing resources external to the FPGA device. Given the diversity of these groups of integrated circuits and the diversity of connectivity between the various arrays of CLBs, programmable switches, and I/O circuits generally employed in FPGA devices, increasing transistor density in FPGA devices has been challenging.

Thus, techniques are described herein for fabricating a stacked-substrate FPGA device in which a second substrate is stacked over a first substrate. Logic transistors (e.g., semiconductor devices and at least some conductive interconnections between them) are generally fabricated on (or over) a first substrate and memory transistors (e.g., SRAM cells and SRAM arrays, among optionally other types of memory cells in some embodiments) are generally fabricated on a second substrate over the first substrate. This has the effect of physically disposing elements of a CLB on two different substrates, and similarly physically disposing elements of a programmable switch on two different substrates. That is a first portion of a CLB corresponding to logic transistors is on a first substrate and a second portion of the CLB corresponding to SRAM transistors is on a second substrate. The same arrangement applies to a programmable switch, thus disposing most (if not all) SRAMs in an FPGA on a same substrate, regardless of whether the SRAMs are associated with a CLB or a programmable switch (or an I/O circuit). Vias passing through the second substrate and through an interlayer dielectric between the first substrate and the second substrate, connect the logic integrated circuits of CLBs and programmable switches on the first substrate to their corresponding memory components on the second substrate. In this way, a density of transistors per unit area of substrate is increased. Furthermore, because some examples of the second substrate are less than 200 nm or less than 100 nm in thickness, the vias passing through the second substrate have a length that can also be less than 200 nm, thus enabling a low enough electrical resistance (e.g., from 1 Ohm to 40 Ohms) to support high rates of data transmission (e.g., in the gigahertz range).

Example Device

Figure 1B:
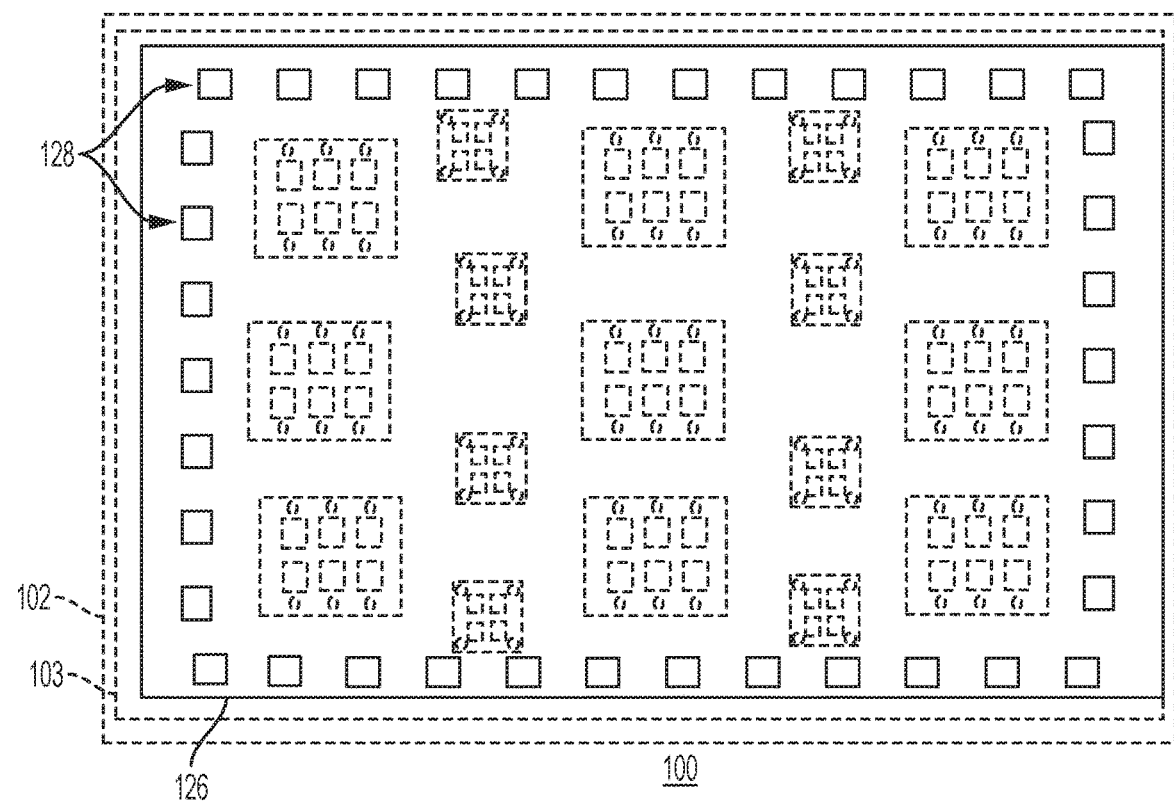
Figure 1C:
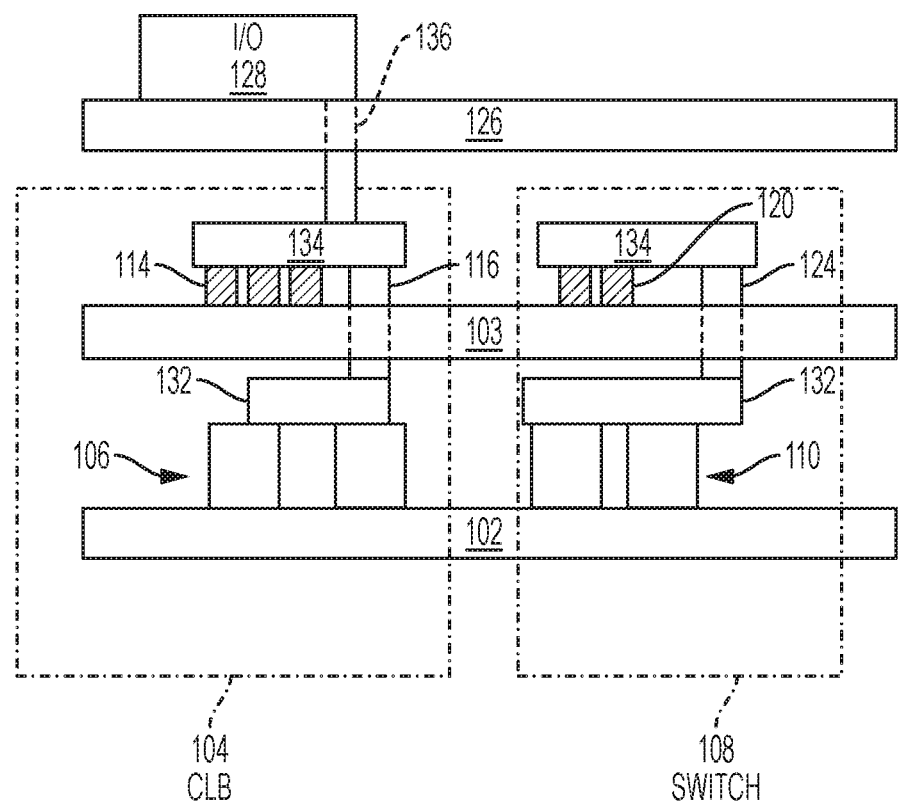
FIG. 1C is a schematic cross-sectional view of the stacked-substrate FPGA device shown in FIGS. 1A and 1B, in accordance with some embodiments of the present disclosure.

FIGS. 1A, 1B, and 1C illustrate schematic plan and cross-sectional views of an example stacked-substrate FPGA device 100 of the present disclosure in which SRAM integrated circuits associated with CLBs and programmable switches are disposed on a second substrate, between a first substrate and a third substrate. It will be appreciated that the examples described herein refer to SRAM integrated circuits for convenience of explanation and that different types of memory cells/arrays can be included as a replacement for and/or a complement to SRAM memory cells/arrays.

Turning first to FIG. 1A, a plan view is shown in which a second (or middle) substrate is exposed. It will be appreciated that the example device 100 includes three stacked substrates, and the presentation of the exposed second substrate is to facilitate explanation.

The view in FIG. 1A includes a first substrate 102, a second substrate 103, a configurable logic block (CLB) 104, and a programmable switch 108. The first substrate 102 is disposed below the second substrate 103 and thus is shown using a broken ("dashed") line to indicate a perimeter. Similarly, the semiconductor structures associated with the first substrate 102 and disposed between the first substrate 102 and the second substrate 103 are also indicated using a broken line. These structures include (but are not limited to) logic transistors 106, 110 associated with the CLBs 104 and programmable switches 108, respectively.

SRAMs 114 associated with the CLBs 104 and SRAMs 120 associated with the programmable switches 108 are also disposed on the second substrate 103. The SRAMs 114, 120 are connected to their corresponding logic transistors 106, 110 by vias 116, 124, respectively. The vias 116, 124 can be configured to pass through the second substrate 103 and be in contact with either the logic transistors 106, 110 directly or through an intervening conductive interconnection.

This configuration thus not only illustrates a stacked-substrate FPGA device, but also the stacked-substrate CLBs and stacked-substrate programmable switches that collectively constitute the stacked-substrate FPGA device 100.

FIG. 1B illustrates a third substrate 126 over the second substrate 103 (thus placing the second substrate 103 between the first substrate 102 and the third substrate 126) on which are disposed various input/output (I/O) blocks that facilitate communication between the FPGA device and external computing resources (e.g., power supply, processors, clock modules).

FIG. 1C illustrates a cross-sectional view of the device in FIG. 1B. The stacked-substrate configuration of CLB 104 and programmable switch 108 can be seen in this figure. As shown, integrated circuits 106, 110 of CLB 104 and switch 108, respectively, are disposed on the first substrate 103 while associated SRAMs 114, 120 are disposed on the second substrate 103. I/O blocks 128 are disposed on the third substrate 126, placing the second substrate 103 over the first substrate 102 and between the first substrate 102 and the third substrate 126. Vias 116 and 124 pass through the second substrate 103 so as to place the SRAMs 114, 120 into contact with the corresponding logic transistors 106, 110 (via conductive interconnects 132, 134). Via 136 passes through the third substrate 126 to place I/O block 128 into contact with, in this example, CLB 104.

It will be appreciated the example device 100 is presented for convenience of illustration and explanation and that other configurations of substrates (e.g., four or more substrates, two substrates) are within the scope of the present disclosure. Furthermore, not every element in FIGS. 1A, 1B, 1C is labeled for clarity of depiction.

Architecture and Methodology

Figure 2:
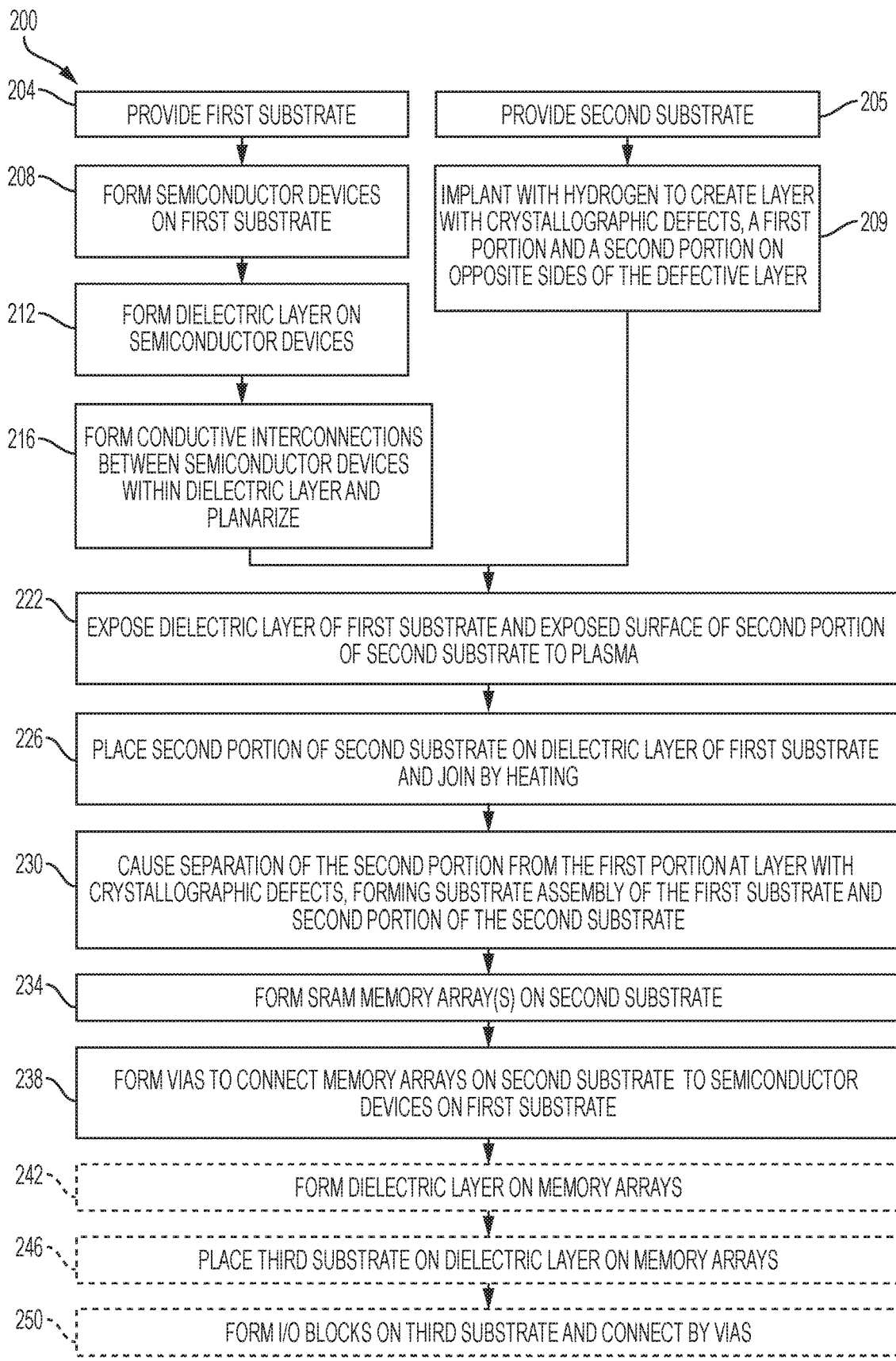
FIG. 2 is a method flow diagram of an example method for the fabrication of a stacked-substrate FPGA device, in accordance with some embodiments of the present disclosure.

FIG. 2 illustrates an example method 200 by which embodiments of the present disclosure can be fabricated. FIGS. 3A-3G illustrate cross-sectional views of various stages of fabrication of the example method depicted in FIG. 2. Concurrent reference to FIG. 2 and FIGS. 3A-3G will facilitate explanation.

Figure 3A:
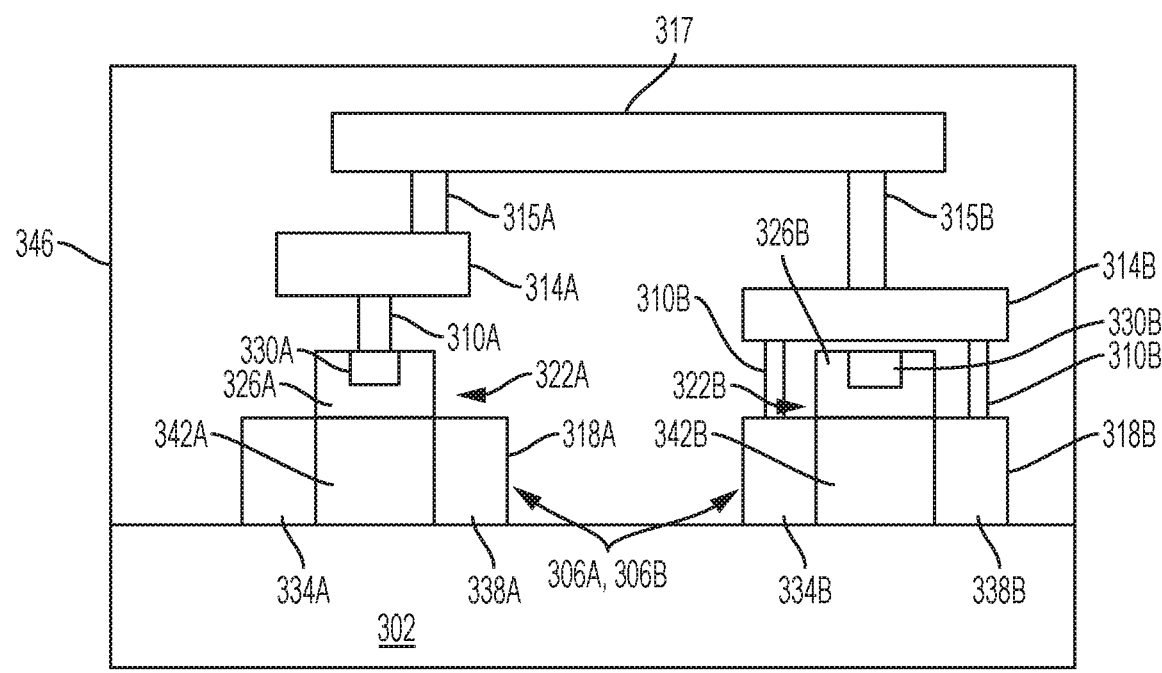
FIGS. 3A-3G illustrate example integrated circuit (IC) structures resulting from a method for forming a stacked-substrate FPGA device, as illustrated in FIG. 2, in accordance with some embodiments of the present disclosure.
Figure 3B:

The method 200 includes providing 204 a first substrate 302 (as shown in FIG. 3A with various logic circuits, described in more detail below) and providing 205 a second substrate 304 (as shown in FIG. 3B). As will be described below in more detail, in some embodiments, logic integrated circuits associated with CLBs can be fabricated on the first substrate 302. These logic circuits can be used to perform various random logic functions associated with FPGAs and their associated CLBs, including communicating with associated SRAMs. In some embodiments, the SRAM cells (and more generally SRAM arrays formed by groups of individual SRAM cells) are fabricated on the second substrate 304.

For both the first substrate 302 and the second substrate 304, any number of suitable substrate types and materials can be used. The substrate may be, for example, a bulk semiconductor wafer (e.g., bulk silicon, germanium, gallium arsenide or other III-V materials, etc.) or an on-insulator configuration (e.g., silicon on-insulator, germanium on-insulator, silicon germanium on-insulator, indium phosphide on-insulator, etc.). In other examples, the substrate (whether one or both of the first substrate 302 and the second substrate 304) may be: gallium nitride (GaN); c-axis aligned indium gallium zinc oxide (c-IGZO); transition metal dichalcogenides including but not limited to $MoS_2$, $MoSe_2$, $CuS_2$, $CuSe_2$, $WS_2$, $WSe_2$, among others; black phosphorus; or InGaAs. The substrate may be p-type, n-type, neutral-type, high or low resistivity, off-cut or not off-cut, etc. The substrate may have a vicinal surface that is prepared by off-cutting the substrate from an ingot, wherein substrate is off-cut at an angle between, for instance, 2° and 8° (e.g., 4° off-cut silicon). Note, however, the substrate need not have any such specific features, and that embodiments of the present disclosure can be implemented using any one of more of numerous different substrates. The thickness of the first substrate 302 can vary and in some embodiments, for example, is in the range of 100 nm to thousands of nanometers. In some cases, the substrate may be subsequently thinned or removed (e.g., by way of backside polish or other suitable thinning/removal process), after formation of the interconnect structure and application of protective layer such as etch stop, passivation layer, inter-layer dielectric (ILD), capping layer, etc. The thickness of the second substrate 304 as provided 205 can be of similar dimension to that of the first substrate 302. Techniques for thinning the second substrate 304 so as to maintain a height of a via through the second substrate to less than 100 nm or less than 200 nm are described below.

Once the first substrate 302 has been provided 204, semiconductor devices 306A, 306B (collectively 306, corresponding to CLB and programmable switch logic circuits) can be formed 208 on the first substrate 302. Examples of logic integrated circuits that the semiconductor devices 306A, 306B can be configured to form include, but are not limited to a variety of logic gates (e.g., AND gates, OR gates, NOR gates), multiplexers, power select circuitry, among others. Conductive vias and conductive lines 314 (described below) can connect various semiconductor devices 306 together, thus connecting various semiconductor devices together to form larger scale integrated circuits.

In some example embodiments, the semiconductor devices 306A, 306B can be formed 208 using standard metal oxide semiconductor (MOS) processing, although any desired process technology can be used. In some examples, such as the one shown in FIG. 3A, the semiconductor devices 306 can be formed 208 using fin-based semiconductor devices, including field effect transistors (also known as "FinFETs"). A FinFET is a MOSFET transistor built around a thin strip of semiconductor material (generally referred to as a fin) that extends from and above an underlying substrate (in this case, the substrate 302). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin).

As shown in FIG. 3A, the fins 318 (318A, 318B in the example shown) of the semiconductor devices 306 include a salient feature composed of a semiconductor material and configured to extend from and above a substrate surface. In some examples, a fin 318 of semiconductor material can be patterned (e.g., lithographically masked and then etched) from the first substrate 302 itself or from a layer of material formed on the substrate 302 that is compositionally different from the first substrate 302. Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

Regardless of the composition, a gate structure 322 (322A, 322B on corresponding fins 318A, 318B) comprising at least one layer of gate dielectric 326 (326A, 326B on corresponding fins 318A, 318B) and at least one layer of gate electrode 330 (330A, 330B on corresponding fins 318A, 318B) can be fabricated on the one or more the fins 318.

Examples of materials that can be used to form the gate dielectric layer 326 include, but are not limited to, dielectric materials used for interlayer dielectric (ILD) described below, as well as "high-k" materials, or both. High-k dielectric materials are those generally considered to have a dielectric constant greater than that of silicon dioxide and include, but are not limited to hafnium oxide, hafnium silicon oxide, lanthanum oxide, lanthanum aluminum oxide, zirconium oxide, zirconium silicon oxide, tantalum oxide, titanium oxide, barium strontium titanium oxide, strontium titanium oxide, yttrium oxide, aluminum oxide, lead scandium tantalum oxide, and lead zinc niobate. In some embodiments, additional processing may be performed on the high-k dielectric layer, such as an annealing process, to improve the quality of high-k material.

The portions of the fin 318 not covered by the gate structure 322 can be replaced with semiconductor material and/or doped to function as a source region 334 (334A, 334B on corresponding fins 318A, 318B) and a drain region 338 (338A, 338B on corresponding fins 318A, 318B). The portion of the fin 318 between the source region 334 and the drain region 338 and between the substrate 302 and the gate structure 322 is sometimes referred to as a semiconductor body and can be characterized as including a channel region 342 (342A, 342B on corresponding fins 318A, 318B) through which charge carriers can flow. A voltage can be applied to the gate structure to control the flow of charge carriers from the source region 334 to the drain region 338.

A layer of dielectric material 346 (sometimes referred to as interlayer dielectric) can be formed 212 on the semiconductor devices 306. The dielectric layer (ILD) may include any number of conventional dielectric materials commonly used in integrated circuit applications, such as oxides (e.g., silicon dioxide, carbon doped oxide), silicon nitride, or organic polymers (e.g., perfluorocyclobutane or polytetrafluoroethylene), fluorosilicate glass, and organosilicates (e.g., silsesquioxane, siloxane, or organosilicate glass). The dielectric material may be low-k or high-k depending on the desired isolation, and may include pores or other voids to further reduce its dielectric constant. Examples of high-k materials have been described above. The dielectric layer thickness can vary and in some example embodiments is in the range of 50 nm to 5000 nm. In some embodiments, the dielectric layer may actually include multiple layers having the same or differing thicknesses. Likewise, in some embodiments, each ILD layer is implemented with the same dielectric material, but in other embodiments, at least some of the ILD layers are implemented with differing dielectric materials.

Techniques for forming 212 the layer of dielectric material 346 can be any of a wide range of suitable deposition techniques, including but not necessarily limited to: physical vapor deposition (PVD); chemical vapor deposition (CVD); spin coating/spin-on deposition (SOD); and/or a combination of any of the aforementioned. Other suitable configurations, materials, deposition techniques, and/or thicknesses for base ILD layer 346 will depend on a given application and will be apparent in light of this disclosure. Numerous ILD configurations and dimensions will be apparent in light of this disclosure and the claimed invention is not intended to be limited to any particular configurations and dimensions. In some embodiments after forming, the ILD can be planarized and/or polished using any suitable technique including chemical-mechanical planarization/polishing (CMP) processes, for example.

As also shown in FIG. 3A, conductive interconnect structures (e.g., contact structures or "vias" 310A, 310B, 315A, 315B) and conductive lines (314A, 314B, 317) can then be formed 216 within the dielectric layer 346. The electrical connection established by the conductive interconnect structures 310, 315, 314, 317 between semiconductor devices 306 can be used to place semiconductor devices in contact with one another to form larger scale integrations of semiconductor devices. The interconnect structures 310, 315, 314, 317 can also be used to place semiconductor devices in contact with SRAMs and I/O blocks using vias disposed through at least a second substrate and/or a third substrate, as described below in more detail. In some examples, the conductive interconnections can be formed of the same materials, and in other cases, may include compositionally different materials, whether different from layer to layer and/or within the same layer. For example, one or more of the vias 310, 315 and the conductive lines 314, 317 can include one or more layers of a conductive liner (e.g., silicon nitride, graphene, tantalum nitride) and one more layers of a conductive metal (e.g., copper, aluminum).

Formation 216 of these conductive interconnect structures can be performed by standard processes of photolithographic patterning and etching (e.g., removal of portions of the dielectric layer 346), followed by deposition of one or more layers in the patterned and etched regions of the dielectric layer 346. Example deposition techniques applicable to conductive material include but are not limited to sputtering, physical vapor deposition (PVD), chemical vapor deposition (CVD), metallo-organic CVD (MOCVD), among others. In some examples, metal lines and vias can be implemented as a dual damascene structure fabricated in the corresponding dielectric layer (ILD). Other embodiments may employ other interconnect structures (e.g., single damascene or other suitable metal interconnect pathway where interconnect metal can be provisioned). The dual damascene trench can be formed in the dielectric layer, for example, using standard lithography including via and trench patterning and subsequent etch processes followed by polishing, cleans, etc., as typically done. As with the preceding examples, the patterning and etch processes can be carried out, for instance, using wet and/or dry etch techniques.

The trenches in the ILD in which vias and conductive lines are formed can have various dimensions depending on the application. In one example case, an upper trench opening (i.e., corresponding to a conductive line portion of a dual damascene via/conductive line structure) is about 10 nm to 100 nm (e.g., 20 to 50 nm) and a lower via opening is about 5 nm to 50 nm (e.g., 10 to 25 nm), and the entire structure has an aspect ratio in the range of about 10:1 to 1.25:1 (e.g., 5:1). As will be appreciated, however, the dimensions and aspect ratio of the damascene trench will vary from one embodiment to the next, and the present disclosure is not intended to be limited to any particular range of dimensions, or any particular trench configuration.

In a more general sense, conductive interconnect cross-sections can include a profile having a first lateral width and a second lateral width that is smaller than the first lateral width, while in another example case the metal interconnect pathway cross-section demonstrates a profile having a substantially uniform lateral width from top to bottom.

In other examples, rather than forming trenches in ILD, the conductive interconnections can be formed by first forming a blanket layer of conductive material followed by patterning and etching of the blanket layer into the conductive interconnect structures illustrated in FIG. 3A. The conductive interconnect structures formed in this way can be electrically isolated from one another by subsequent deposition of dielectric material, as described above.

Note that the layout shown in FIG. 3A (and subsequent figures) is not intended to implicate any particular feature spacing or density. Rather, this layout is simply an arbitrary example, and any number of other layout designs can benefit from an embodiment of the present invention. In some examples, the layers of interconnection (e.g., vias and conductive lines) are demarcated from neighboring layers by an etch stop layer (e.g., a nitride layer) and may also include a barrier layer to prevent electromigration of material between adjacent conductive interconnect structures (e.g., nitride layers, among others).

As mentioned above, the method 200 also includes providing 205 a second semiconductor substrate 304, which in various embodiments can be any one of the substrate compositions or types previously described in the context of the first substrate 302. As indicated above, the final thickness of the second substrate as integrated into a stacked-substrate FPGA device is less than 200 nm or less than 100 nm so as to facilitate a similar depth (e.g., less than 200 nm or less than 100 nm) of a via connecting the SRAM memory cells to the logic devices on the first substrate.

Figure 3C:
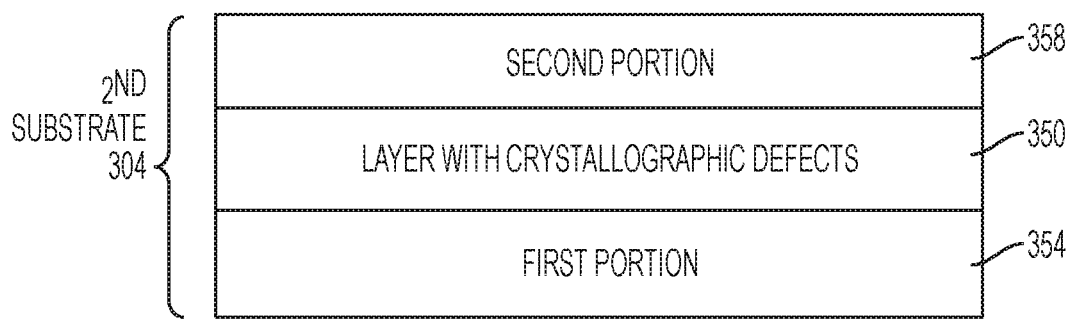

To accomplish this thinning, the second substrate 304 can be first implanted 209 with, for example, accelerated hydrogen ions through one of the exposed surfaces. In some examples, as shown in FIG. 3C, the accelerated hydrogen ions cause the formation of a sub-surface layer 350 with crystallographic defects that can be between from 5 nm to 500 nm below the surface through which the ions penetrate. More generally, the accelerated ions interact with atoms within the lattice of the second substrate 304 so as to displace some of the atoms from crystal lattice sites, thus forming vacancies within the crystalline lattice as one type of crystallographic defect. In some examples, dislocations and dislocation loops can form as another type of crystallographic defect. Regardless of the type or types of crystallographic defects that are formed by ion implantation, the defective layer 350 formed is a location at which the substrate 304 will cleave upon heat treatment.

In some examples, implantation can be accomplished by accelerating hydrogen ions (formed by exposure of hydrogen gas to an electrically biased filament so as to form a hydrogen plasma) at voltages of anywhere between 20 keV to 100 keV. Implantation densities of on the order of $10^{15}$ atoms/cm$^3$ to $10^{22}$ atoms/cm$^3$ can be used to form the defective layer 350. In some examples, the implantation current is from 5 mA/cm$^2$ of substrate to 10 mA/cm$^2$. In some examples, accelerated hydrogen ions within the previously indicated acceleration voltages and implantation densities are capable of producing on the order of from $10^{22}$ vacancies/cm$^3$ to $10^{23}$ vacancies/cm$^3$. In a specific example, an accelerating voltage of 40 keV can produce an approximately normal distribution of vacancies from 1 nm to 700 nm below the exposed surface through which the hydrogen ions are implanted, with a median of the distribution at about 500 nm below the surface (+/−50 nm).

In some examples, the defective layer 350 can have a thickness (measured perpendicular to the surface of the substrate 304 through which the accelerated ions pass) within any of the following ranges: from 5 nm to 50 nm; from 5 nm to 25 nm; from 5 nm to 10 nm; from 10 nm to 50 nm; from 25 nm to 50 nm. It will be appreciated that the accelerating voltage of the parting (hydrogen) ions can be selected so that a depth below the surface of the defective layer 350 is within a desired range according to standard techniques. For example, a greater accelerating voltage of the hydrogen ions will cause the hydrogen ions to impinge to a distance greater from the exposed surface than a lower accelerating voltage. In some embodiments, the accelerating voltage is selected to cause the defective layer 350 to be within the range below the surface indicated above (i.e., from 5 nm to 500 nm below the exposed surface).

In other examples, other accelerated particles, including but not limited to helium ions, can be used to create the defective layer 350.

As shown in FIG. 3C, for convenience of explanation, the defective layer 350 can be considered to divide the second substrate 304 into a first portion 354 and a second portion 358 on opposing sides of the defective layer 350. As can be appreciated in light of the present disclosure, a depth of the defective layer 350 essentially defines a thickness of the second portion 358.

Figure 3D:
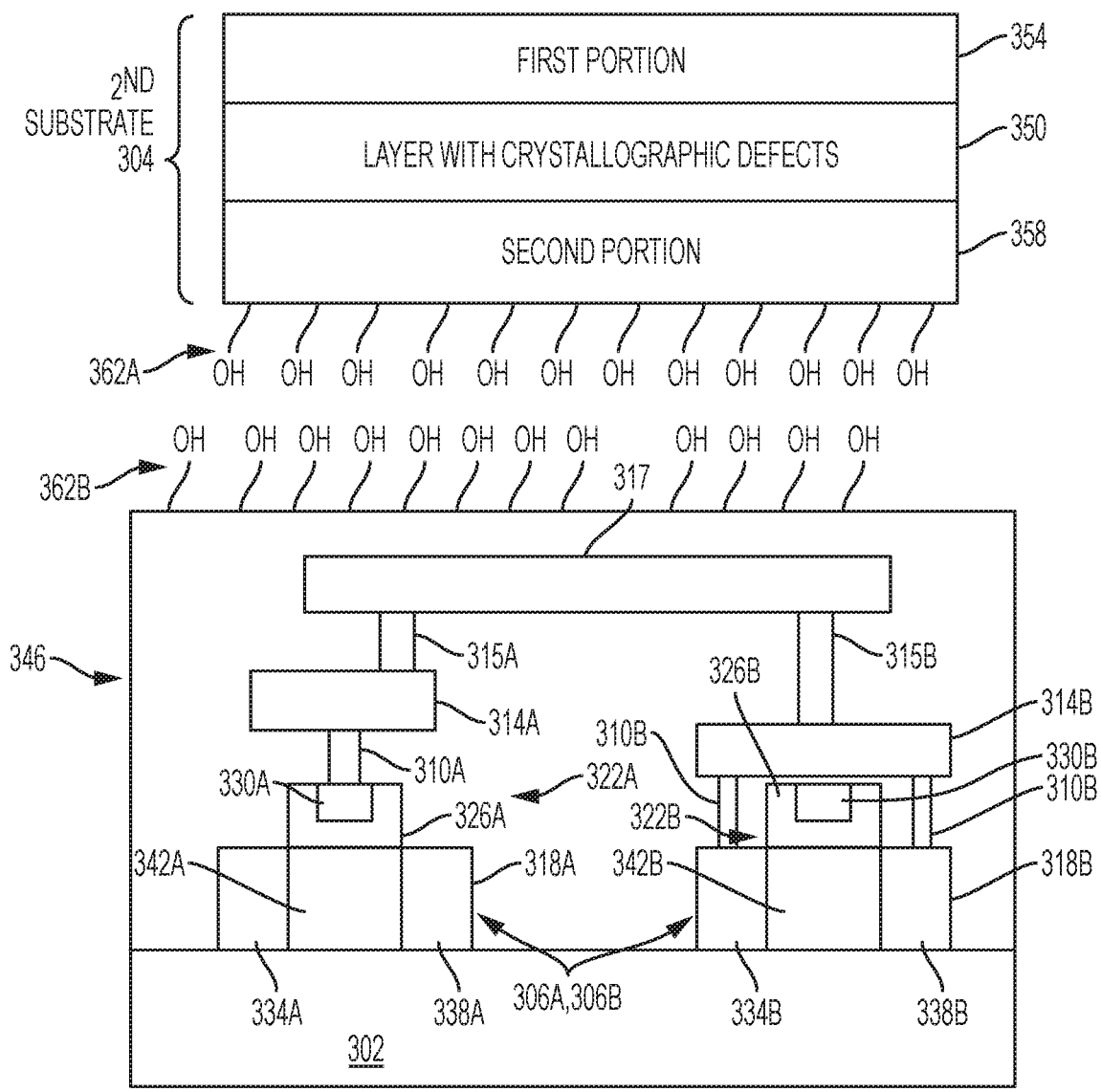

Surfaces of the first substrate 302 (e.g., the dielectric layer 346) and the second substrate 304 (in particular, the exposed surface of the second portion 358 of the second substrate 304) ultimately to be joined together are then exposed 222 to a plasma. In one example, exposure 222 is to an oxygen plasma. In other examples, exposure 222 can be to a UV enhanced ozone ($O_3$) plasma, an aqueous ($H_2O$) ozone solution plasma, or any other plasma chemistry capable of terminating the exposed surfaces in hydroxyl (OH) groups. As schematically shown in FIG. 3D, exposure 222 to the oxygen plasma creates layers 362A, 362B on the treated surfaces that include a plurality of hydroxyl groups.

The method 200 continues by placing 226 the plasma treated surface of the second portion 358 of the second substrate 304 in contact with the plasma treated surface of the first substrate 302, thus bringing the layers 362A, 362B into contact with one another. This initial contact between the plasma treated surfaces can be performed at ambient temperature (e.g., between 20° C. and 25° C.) and ambient atmospheric pressure (e.g., 1 atmosphere +/−5%).

Placing 226 the layers 362A, 362B into contact with one another and then heating the two substrates 302, 304 causes a condensation reaction to occur between hydrogen and hydroxyl groups that terminate the confronting surfaces. In some examples, the two substrates 302, 304 are heated 226 at temperatures anywhere between 300° C. and 400° C. (within normal equipment variation and measurement tolerances of approximately +/−2° C.) for between 10 minutes and 60 minutes in an inert atmosphere (e.g., $N_2$, Ar). As water is produced by the reaction and removed from the interface between the layers 362A, 362B by vaporization, a covalent bond is formed between the second portion 358 of the second substrate 304 and the ILD 346 of the first substrate 302, thus joining the two substrates together. In the case of a second substrate 304 fabricated from silicon, and a dielectric layer 346 fabricated from silicon dioxide, the covalent bonds formed are silicon-oxygen-silicon bonds. The silicon-oxygen-silicon bonds that bridge the interface are strong enough so that no additional adhesive or connection is needed to bond the first substrate 302 to the second substrate 304.

Figure 3E:
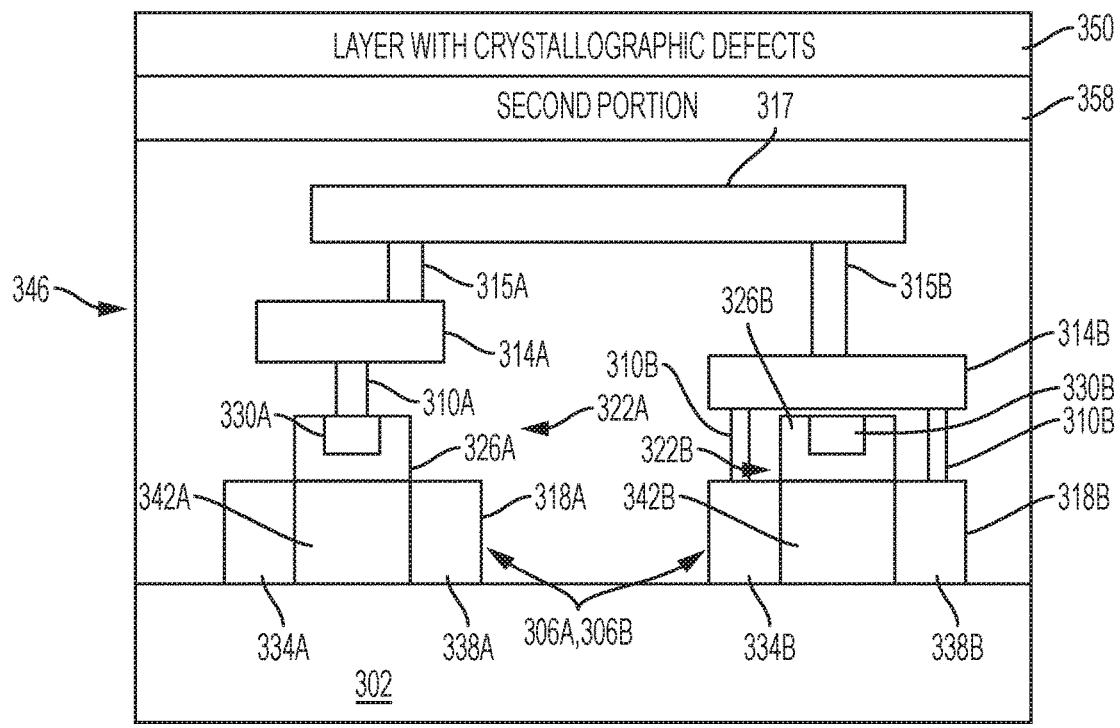
Figure 3F:
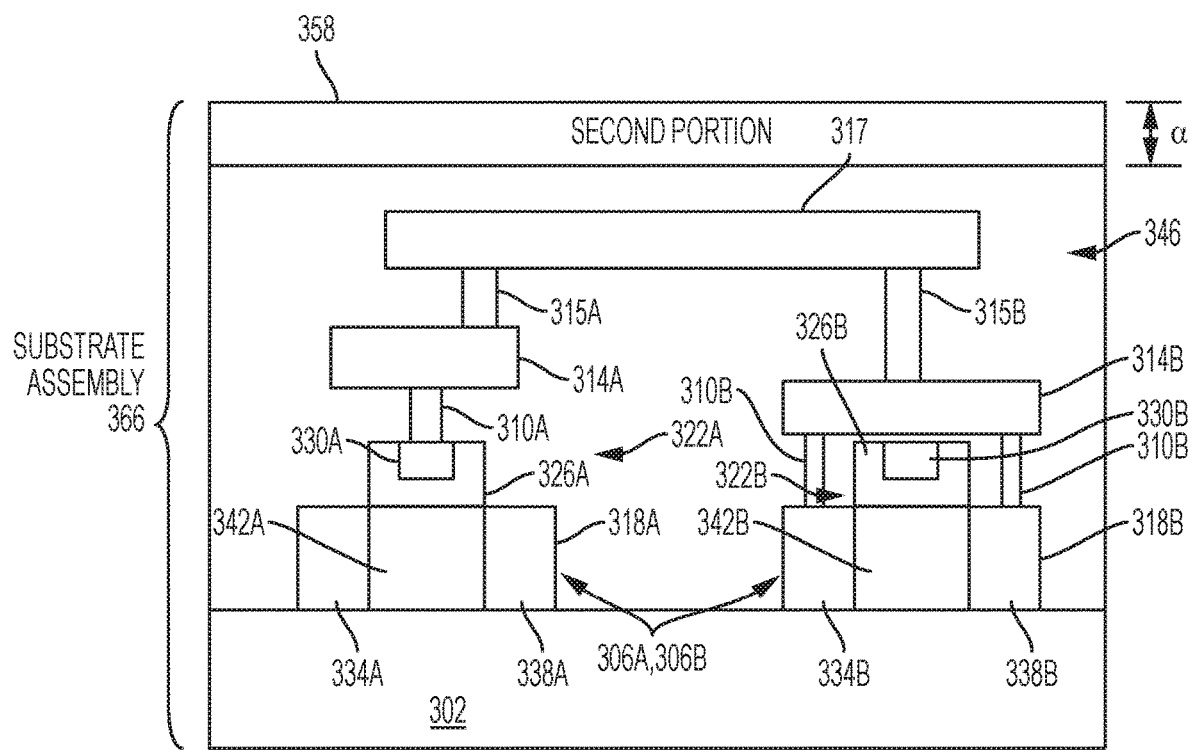

The heat applied to the attached first substrate 302 and second substrate 304 also causes the separation 230 of the first portion 354 of the second substrate 304 from the layer with crystallographic defects 350. In some cases, this can be described as "exfoliation" of first portion 354 from the second substrate 304. As shown in FIG. 3E, in some cases some or all of the layer with crystallographic defects 350 remains on the second portion 358 after the heat induced separation 230 of the first portion 354. In some embodiments, any remaining layer 350 with crystallographic defects can be removed by standard polishing and planarization techniques, including but not limited to chemical mechanical polishing (CMP). In some examples, some of the material comprising the second portion 358 can be removed through continued chemical mechanical polishing so that a thickness (indicated in FIG. 3F as dimension a) can be within any of the following ranges: from 5 nm (nm) to 200 nm; from 5 nm to 100 nm; from 10 nm to 100 nm; from 10 nm to 50 nm; from 15 nm to 30 nm. The resulting structure, referred to herein as a substrate assembly 366, is shown in FIG. 3F.

Figure 3G:
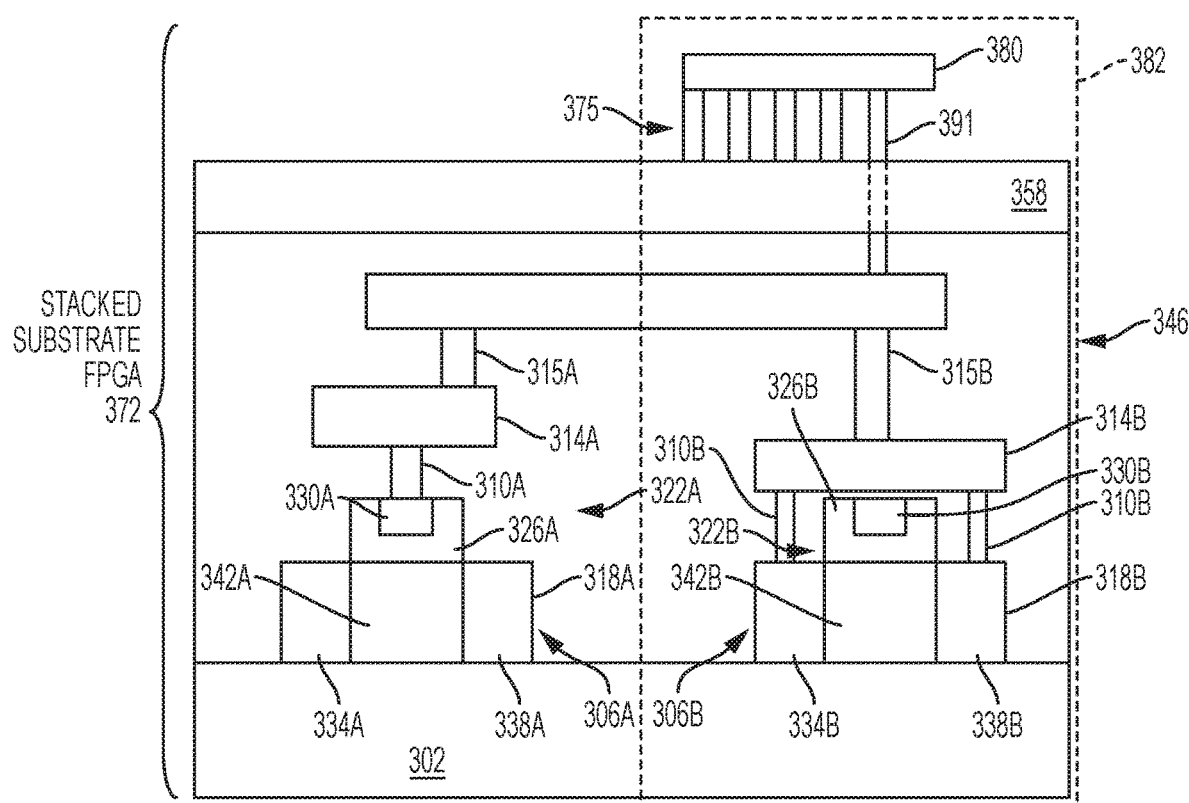

In another embodiment, the fabrication of the second portion 358 can include the use of a silicon germanium (SiGe) layer. For example, a SiGe layer (of from 10 nm thick to 30 nm thick) on the second substrate can be composed and formed to have a coherent and epitaxial interface (i.e., a lattice parameter mismatch of less than 2%) with the underlying substrate (e.g., a silicon substrate). A silicon layer of from 10 nm to 20 nm thick corresponding to the second portion 358 can then be formed (epitaxially and coherently) on the SiGe layer. The defective layer 350 can then be formed via ion implantation (as described above) on a side of the SiGe layer opposite that of the silicon layer corresponding to the second portion 358. After separation of the second portion 358 from the substrate, the crystallographically defective layer can be removed via CMP until the SiGe layer is exposed. Silicon can be selectively removed from SiGe using CMP processes that include ammonium hydroxide ($NH_4OH$) or tetramethyl ammonium hydroxide ($N(CH_3)_4OH$). In this way, the SiGe acts an "etch stop." In other words, the processes used to remove the silicon layer are composed so as to not remove the SiGe layer or remove it at a rate that is at least 5 times slower than silicon is removed. Once the SiGe layer is exposed and subsequently detected, the etch composition can be changed so that the SiGe layer can be removed using a selective etch that removes SiGe but does not remove Si m (e.g., KOH). Using a SiGe layer as an etch stop as described above can, in some examples, enhance control of a thickness α of the second portion 358. It will be appreciated that the second portion 358 essentially becomes a semiconductor substrate on which semiconductor devices can be fabricated, as is explained below Having thus prepared the substrate assembly 366, SRAM cell components and memory arrays can be formed 234 on the exposed surface of the second portion 358 on a side opposite that of the first substrate 302. Vias through the second portion 358 can connect the SRAM cells with corresponding logic semiconductor devices on the underlying first substrate 302 to form CLBs and programmable switches, as illustrated in FIGS. 1A-1C. This forms a stacked-substrate FPGA device 372, an example of which is shown in FIG. 3G. Similar to the preceding cross-sections, the cross-section of FIG. 3G is taken perpendicular to the gates of some of the semiconductor devices on the first substrate 302.

The portion of the embodiment of the stacked-substrate FPGA device 372 shown in FIG. 3G includes the substrate assembly 366, described above, as well as SRAM cells 375, interconnect 380, and inter-substrate via 391. SRAM cells 375 can be formed using standard techniques, such as those described above, for the formation of the transistors and interconnections that constitute the SRAM cells (e.g., lithography, etching, implantation, planarization, single and dual damascene interconnection fabrication processes).

The SRAM cells/arrays 375 and semiconductor devices 306A, 306B (and/or corresponding circuits) can be placed into contact (e.g., electrical communication) with one another by forming 238 a via 391 that extends from the conductive interconnection 380, through the dielectric layer 390, the second portion 358 of the second substrate, and the dielectric layer 346. In this example, the via 391 is connected to the conductive interconnection 317. It will be appreciated that in other examples, a via 391 can extend to different levels of conductive interconnect or even to a contact on a drain region of a semiconductor device (e.g., contact structure 310B on drain region 338B). The via 391 can be formed 238 using standard techniques, such as lithographic patterning and etching. These have been described above in the context of interconnections 310, 314, 315, 317, among others, and need no further explanation.

The placement of the via 391 can be selected using standard optical alignment techniques used to align various levels of interconnections. In some examples in which the second portion 358 of the second substrate 304 is optically transparent (due to its thickness α of less than 200 nm, less than 100 nm, or in some cases even less than 50 nm), standard alignment techniques can be used to align the via 391 with corresponding structure (whether a conductive interconnection or a semiconductor device) on the first substrate 302. In some examples, these standard alignment techniques involve the use of alignment structures and/or patterns that can be used as reference points by which lithographic masks and other process tools can be aligned. In other examples, some of the second portion 358 of the second substrate 304 can be removed (e.g., by lithographic patterning and etching) so that these alignment structures on the first substrate 302 (sometimes colloquially referred to as "fiducial structure" or "alignment marks") can be detected.

As described above, because the thickness α of the second portion is less than 200 nm (and in some cases less than 100 nm), the formation of the via 391 can use techniques similar or the same as those used to form interconnections 315A, 315B, 310A, 310B. That is, standard single damascene or dual damascene techniques for the fabrication of vias between metal levels in a "back end of line" (BEOL) of an integrated circuit can be adapted to the via 391 by selecting processes that can pattern dielectric material 390, second substrate second portion 358 (whether silicon or some other composition), and then dielectric material 346. As also indicated above, a depth of the via 391 can correspond to the thickness of the second portion 358 plus 5-10 nm above the surface (to contact to the conductive interconnection 380) and plus 5-10 nm below the second portion 358 (to an interconnections). In embodiments, a depth of the via 391 is less than 200 nm, less than 100 nm, less than 50 nm, or less than 20 nm. In embodiments, the depth of via 391 corresponding to (and in some cases 5 nm-20 nm greater than) the thickness α of the second portion 358 leads to a via 391 electrical resistance of from 1 Ohm to 40 Ohms or within any of the following sub-ranges: 1 Ohm to 5 Ohms; 1 Ohm to 10 Ohms; 10 Ohms to 30 Ohms; 15 Ohms to 35 Ohms.

As indicated in the figure, this arrangement can form a stacked-substrate CLB 382, as described above. It will be appreciated that a similar arrangement can be used to form a stacked-substrate programmable switch also on the substrates 302 and 358, as shown in FIG. 1C.

Optionally, another dielectric layer can be formed 242 on the SRAM memory arrays and a third substrate placed 246 on the dielectric layer. The third substrate can be processed according to the elements described above in the method 200 so as to produce a thickness that is less than 200 nm, less than 100 nm, or even less than 50 nm thick (e.g., elements 209, 222, 226, 230). I/O blocks can be formed 250 on the third substrate and placed into contact with SRAMs 375 and/or the logic circuits (e.g., semiconductor devices 306A, 306B).

Example System

Figure 4:
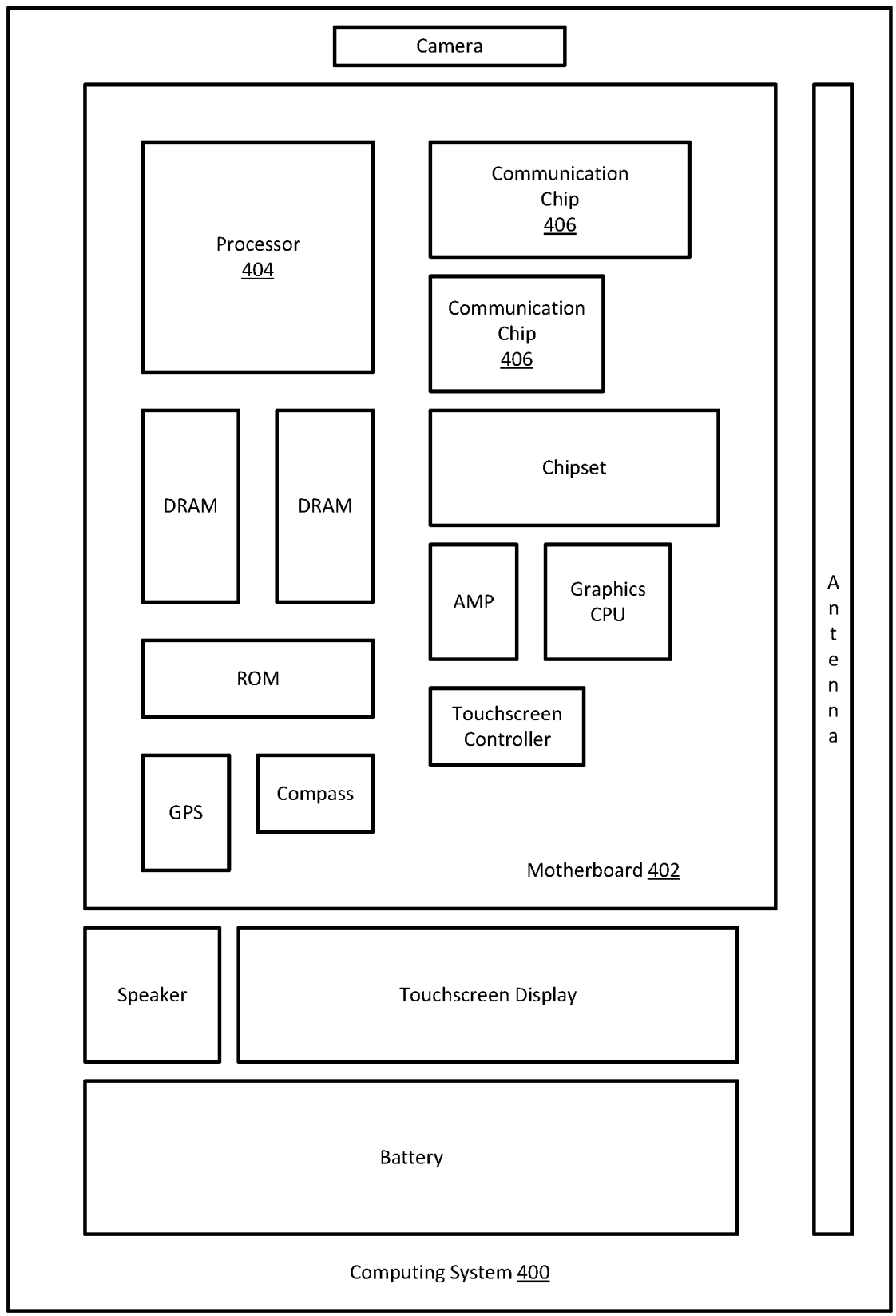
FIG. 4 illustrates a computing system implemented with integrated circuit structures and/or transistor devices formed using the techniques disclosed herein, in accordance with some embodiments of the present disclosure.

FIG. 4 is an example computing system implemented with one or more of the integrated circuit structures as disclosed herein, in accordance with some embodiments of the present disclosure. As can be seen, the computing system 400 houses a motherboard 402. The motherboard 402 may include a number of components, including, but not limited to, a processor 404 and at least one communication chip 406, each of which can be physically and electrically coupled to the motherboard 402, or otherwise integrated therein. As will be appreciated, the motherboard 402 may be, for example, any printed circuit board, whether a main board, a daughterboard mounted on a main board, or the only board of system 400, etc.

Depending on its applications, computing system 400 may include one or more other components that may or may not be physically and electrically coupled to the motherboard 402. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 400 may include one or more integrated circuit structures or devices configured in accordance with an example embodiment (e.g., to include one or more stacked-substrate FPGA devices, as variously provided herein). In some embodiments, multiple functions can be integrated into one or more chips (e.g., for instance, note that the communication chip 406 can be part of or otherwise integrated into the processor 404).

The communication chip 406 enables wireless communications for the transfer of data to and from the computing system 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others. In some embodiments, communication chip 406 may include one or more transistor structures having a gate stack an access region polarization layer as variously described herein.

The processor 404 of the computing system 400 includes an integrated circuit die packaged within the processor 404. In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 406 also may include an integrated circuit die packaged within the communication chip 406. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 404 (e.g., where functionality of any chips 406 is integrated into processor 404, rather than having separate communication chips). Further note that processor 404 may be a chip set having such wireless capability. In short, any number of processor 404 and/or communication chips 406 can be used. Likewise, any one chip or chip set can have multiple functions integrated therein.

In various implementations, the computing system 400 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit including a field programmable gate array (FPGA) device, the integrated circuit comprising: a first semiconductor substrate; a second semiconductor substrate that is less than 200 nm thick over the first semiconductor substrate; a dielectric layer between the first semiconductor substrate and the second semiconductor substrate; a configurable logic block (CLB) including a logic transistor between the first semiconductor substrate and the second semiconductor substrate, and a memory cell over the second semiconductor substrate; and a via connecting the logic transistor and the memory cell, the via at least partially disposed through the second semiconductor substrate.

Example 2 includes the subject matter of Example 1, wherein the second semiconductor substrate is from 15 nm to 50 nm thick.

Example 3 includes the subject matter of Example 1 or 2, wherein the via has a depth of from 15 nm to 50 nm.

Example 4 includes the subject matter of any of the preceding Examples, wherein the via has an electrical resistance of from 1 Ohm to 40 Ohms.

Example 5 includes the subject matter of Examples 1 and 4, wherein the second semiconductor substrate is from 10 nm to 20 nm thick.

Example 6 includes the subject matter of Examples 1, 4, and 5, wherein the via has a depth of from 10 nm to 20 nm.

Example 7 includes the subject matter of any of the preceding Examples, wherein the second semiconductor substrate is optically transparent.

Example 8 includes the subject matter of any of the preceding Examples, further comprising: a third semiconductor substrate that is less than 200 nm thick over the second semiconductor substrate; one or more of an additional logic transistor or a memory array over the third semiconductor substrate; wherein the via further comprises a first via connecting the logic transistor and the memory cell and a second via connecting the one or more of the additional logic transistor or the memory array to the CLB or a programmable switch; and wherein the dielectric layer comprises a first dielectric layer between the first semiconductor substrate and the second semiconductor substrate and a second dielectric layer between the second semiconductor substrate and the third semiconductor substrate.

Example 9 includes the subject matter of Example 8, wherein the first via and the second via comprise an electrical resistance of from 1 Ohm to 40 Ohms.

Example 10 includes the subject matter of any of the preceding Examples, wherein one or more of the logic transistor and the memory cell comprise a source region, a drain region, and a semiconductor body between the source region and the drain region.

Example 11 includes the subject matter of any of the preceding Examples, wherein one or more of the logic transistor and the memory cell comprise a fin of a semiconductor material.

Example 12 includes the subject matter of any of the preceding Examples, further comprising: an additional semiconductor substrate that is less than 200 nm thick over the second semiconductor substrate; at least one additional dielectric layer between the second semiconductor substrate and the additional semiconductor substrate; and a plurality of input/output blocks on the additional semi conductor substrate.

Example 13 includes the subject matter of Example 12, further comprising an additional via through the additional semiconductor substrate connecting the input/output blocks to at least the CLB.

Example 14 includes the subject matter of any of the preceding Examples, wherein the via comprises a first via and a second via disposed through the second semiconductor substrate and the dielectric layer between the first semiconductor substrate and the second semiconductor substrate.

Example 15 includes the subject matter of any of the preceding Examples, wherein the memory cell is a first memory cell, the integrated circuit further comprising a programmable switch, the programmable switch comprising: a switch transistor between the first semiconductor substrate and the second semiconductor substrate; and a second memory cell over the second semiconductor substrate.

Example 16 includes the subject matter of Example 15, further comprising a third via connecting the switch and the second memory cell.

Example 17 includes the subject matter of Example 16, the first via comprises a plurality of first vias disposed in a first pattern having a first periodicity; the first via comprises a plurality of first vias disposed in a first pattern having a first periodicity; the second via comprises a plurality of second vias disposed in a second pattern different from the first pattern and having a second periodicity different from the first periodicity; and the third via comprises a plurality of third vias disposed in a third pattern different from the first pattern and the second pattern and having a third periodicity different from the first periodicity and the second periodicity.

Example 18 includes the subject matter of any of the preceding Examples, wherein the memory cell is an SRAM cell.

What is claimed is:

1. An integrated circuit including a field programmable gate array (FPGA) device, the integrated circuit comprising:
   a first semiconductor substrate;
   a second semiconductor substrate over the first semiconductor substrate;
   a dielectric layer between the first semiconductor substrate and the second semiconductor substrate;
   a configurable logic block (CLB) including a logic transistor between the first semiconductor substrate and the second semiconductor substrate, and a memory cell over the second semiconductor substrate; and
   a via directly connecting the logic transistor and the memory cell, the via disposed entirely through the second semiconductor substrate and extending above an uppermost surface of the second semiconductor substrate, the via over and vertically overlapping with the logic transistor and beneath and vertically overlapping with the memory cell, and the via having a bottommost surface above an uppermost surface of the logic transistor.

2. The integrated circuit of claim 1, wherein the second semiconductor substrate is from 15 nm to 50 nm thick.

3. The integrated circuit of claim 2, wherein the via has a depth of from 15 nm to 50 nm.

4. The integrated circuit of claim 3, wherein the via has an electrical resistance of from 1 Ohm to 40 Ohms.

5. The integrated circuit of claim 1, wherein the second semiconductor substrate is from 10 nm to 20 nm thick.

6. The integrated circuit of claim 5, wherein the via has a depth of from 10 nm to 20 nm.

7. The integrated circuit of claim 1, wherein the second semiconductor substrate is optically transparent.

8. The integrated circuit of claim 1, further comprising:
   a third semiconductor substrate over the second semiconductor substrate; one or more of an additional logic transistor or a memory array over the third semiconductor substrate;
   wherein the via is a first via connecting the logic transistor and the memory cell and the integrated circuit further comprises a second via connecting the one or more of the additional logic transistor or the memory array to the CLB or a programmable switch; and
   wherein the dielectric layer is a first dielectric layer between the first semiconductor substrate and the second semiconductor substrate and the integrated circuit further comprises a second dielectric layer between the second semiconductor substrate and the third semiconductor substrate.

9. The integrated circuit of claim 8, wherein the first via and the second via comprise an electrical resistance of from 1 Ohm to 40 Ohms.

10. The integrated circuit of claim 1, wherein one or more of the logic transistor and the memory cell comprise a source region, a drain region, and a semiconductor body between the source region and the drain region.

11. The integrated circuit of claim 1, wherein one or more of the logic transistor and the memory cell comprise a fin of a semiconductor material.

12. The integrated circuit of claim 1, further comprising: an additional semiconductor substrate that is less than 200 nm thick over the second semiconductor substrate; at least one additional dielectric layer between the second semiconductor substrate and the additional semiconductor substrate; and a plurality of input/output blocks on the additional semiconductor substrate.

13. The integrated circuit of claim 12, further comprising an additional via through the additional semiconductor substrate connecting the input/output blocks to at least the CLB.

14. The integrated circuit of claim 1, wherein the via comprises a first via and a second via disposed through the second semiconductor substrate and the dielectric layer between the first semiconductor substrate and the second semiconductor substrate.

15. The integrated circuit of claim 14, wherein the memory cell is a first memory cell, the integrated circuit further comprising a programmable switch, the programmable switch comprising: a switch transistor between the first semiconductor substrate and the second semiconductor substrate; and a second memory cell over the second semiconductor substrate.

16. The integrated circuit of claim 15, further comprising a third via connecting the switch and the second memory cell.

17. The integrated circuit of claim 16, wherein: the first via comprises a plurality of first vias disposed in a first pattern having a first periodicity; the second via comprises a plurality of second vias disposed in a second pattern different from the first pattern and having a second periodicity different from the first periodicity; and the third via comprises a plurality of third vias disposed in a third pattern different from the first pattern and the second pattern and having a third periodicity different from the first periodicity and the second periodicity.

18. The integrated circuit of claim 1, wherein the memory cell is an SRAM cell.

19. The integrated circuit of claim 1, wherein the second semiconductor substrate is less than 200 nm thick.

20. The integrated circuit of claim 8, wherein the third semiconductor substrate is less than 200 nm thick.

* * * * *